United States Patent
Leibfritz

(10) Patent No.: US 10,345,420 B2
(45) Date of Patent: Jul. 9, 2019

(54) METHOD, A CALIBRATION UNIT AND A SYSTEM FOR DETERMINING SYSTEM ERRORS AND POWER VALUES FOR THE CALIBRATION OF A NETWORK ANALYSER

(71) Applicant: Rohde & Schwarz GmbH & Co. KG, Munich (DE)

(72) Inventor: Martin Leibfritz, Aying (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 398 days.

(21) Appl. No.: 15/027,677

(22) PCT Filed: Aug. 26, 2014

(86) PCT No.: PCT/EP2014/068027
§ 371 (c)(1),
(2) Date: Apr. 6, 2016

(87) PCT Pub. No.: WO2015/051944
PCT Pub. Date: Apr. 16, 2015

(65) Prior Publication Data
US 2016/0245892 A1 Aug. 25, 2016

(30) Foreign Application Priority Data

Oct. 7, 2013 (DE) .......... 10 2013 220 165
Jan. 14, 2014 (DE) .......... 10 2014 200 517

(51) Int. Cl.
*G01R 27/28* (2006.01)
*G01R 35/00* (2006.01)

(52) U.S. Cl.
CPC .......... *G01R 35/005* (2013.01); *G01R 27/28* (2013.01)

(58) Field of Classification Search
CPC .............. G01R 27/28; G01R 35/005
(Continued)

(56) References Cited

U.S. PATENT DOCUMENTS

| 7,061,254 B1 | 6/2006 | Shoulders et al. |
| 2005/0264301 A1 | 12/2005 | Scott |

(Continued)

FOREIGN PATENT DOCUMENTS

| DE | 19849580 | 11/2002 |
| DE | 19757675 | 4/2003 |

(Continued)

OTHER PUBLICATIONS

International Preliminary Report on Patentability dated Apr. 21, 2016, for corresponding PCT Application No. PCT/EP2014/068027, 9 pages.

(Continued)

*Primary Examiner* — Melissa J Koval
*Assistant Examiner* — Trung Nguyen
(74) *Attorney, Agent, or Firm* — Lee & Hayes, P.C.

(57) ABSTRACT

A method and a system for determining system errors and power values for the calibration of a network analyzer (2) containing several test ports ($1_1, \ldots, 1_i, 1_j, \ldots, 1_n$) connects the individual test ports ($1_1, \ldots, 1_i, 1_j, \ldots, 1_n$) in each case sequentially to a short calibration standard (3), to an open calibration standard (4) and to a power detector (5), and measures a signal reflected from the short calibration standard (3), from the open calibration standard (4) and from the power detector (5) in the case of an excitation of the respective test port with a measured excitation signal. Following this, system errors for every test port ($1_1, \ldots, 1_i, 1_j, \ldots, 1_n$) are determined from the respectively measured excitation signal and the respectively measured reflected signals, and, finally, the power value of the excitation signal is measured at least at one test port ($1_1, \ldots, 1_i, 1_j, \ldots, 1_n$) by the power detector (5) connected in each case to this test port ($1_1, \ldots, 1_i, 1_j, \ldots, 1_n$).

12 Claims, 2 Drawing Sheets

Figure 1:
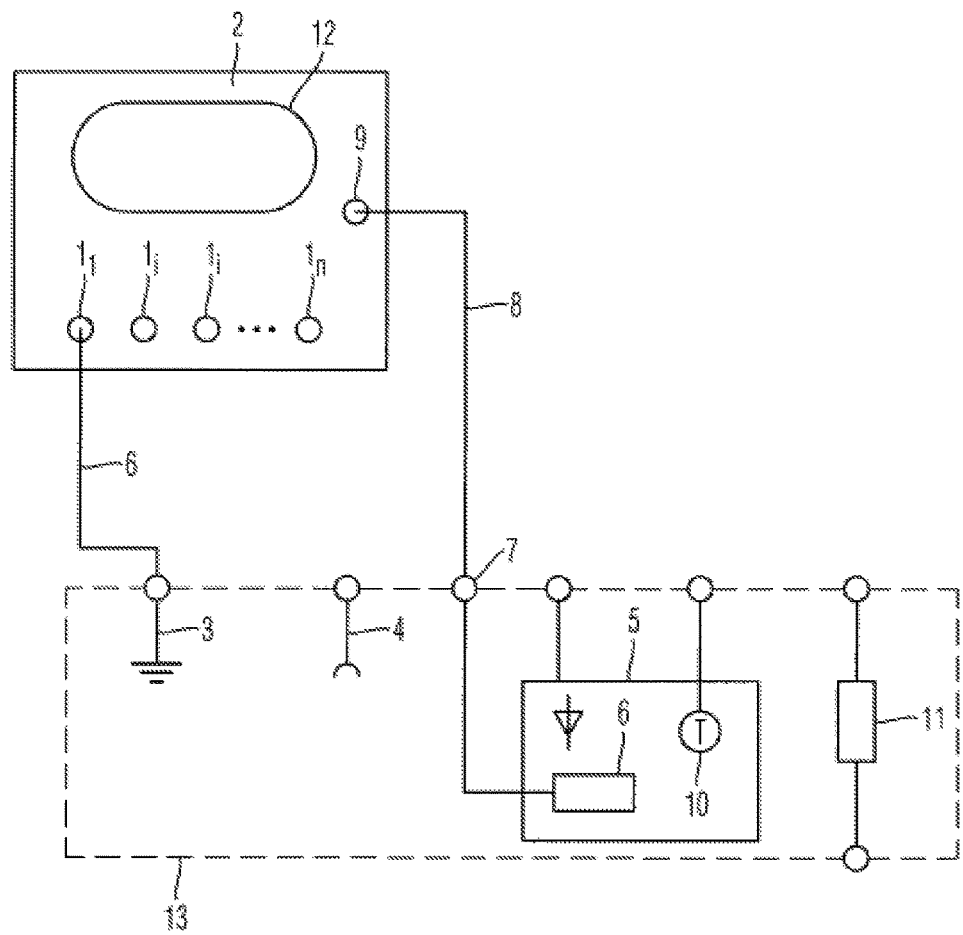

(58) Field of Classification Search
USPC .................................................. 324/600, 601
See application file for complete search history.

(56) References Cited

U.S. PATENT DOCUMENTS

| | | | |
|---|---|---|---|
| 2006/0005065 A1 | 1/2006 | Nakayama et al. | |
| 2009/0092177 A1 | 4/2009 | Dvorak | |
| 2010/0317297 A1 | 12/2010 | Kratochwil et al. | |
| 2014/0095947 A1* | 4/2014 | Mozak | G11C 29/56 714/718 |
| 2015/0177357 A1* | 6/2015 | Leibfritz | G01R 27/04 324/601 |

FOREIGN PATENT DOCUMENTS

| | | |
|---|---|---|
| DE | 10205359 | 8/2003 |
| DE | 102005005887 | 8/2006 |
| DE | 102007028725 | 12/2008 |
| WO | WO2007096059 | 8/2007 |

OTHER PUBLICATIONS

Blockley, et al., "Mixer-based, Vector-Corrected Signal/Network Analyzer Offering 300kHz-20GBz Bandwidth and Traceable Phase Response", 2005 IEEE MTT-S International Microwave Symposium, Piscataway, NJ, USA, IEEE, Jun. 12, 20015, 4 pages.

Anritsu "Power Sensors (MA24XXA/B/D and MA2400XA) Operation Manual", Jan. 2, 1998, 47 pages.

Roeder, T. et al., "Using S-Parameters with R&S NRP-Z Power Sensors Application Note" Rohde & Schwarz GmbH & Co. KG, Jul. 24, 2012, 28 pages.

Scott, J. et al., "A New Instrument Architecture for Millimetre-Wave Time-Domain Signal Analysis", ARFTG 63rd Conference, Spring 2014, Ft. Worth, TX, Jul. 11, 2004, Piscataway, NJ, USA, IEEE, 6 pages.

Rohde & Schwarz "Manual Thermal Power Sensor", Oct. 6, 1999, 15 pages.

"Thermal power sensors up to 50 GHz and 67 GHz", Feb. 27, 2010, 4 pages.

* cited by examiner

METHOD, A CALIBRATION UNIT AND A SYSTEM FOR DETERMINING SYSTEM ERRORS AND POWER VALUES FOR THE CALIBRATION OF A NETWORK ANALYSER

The invention relates to a method, a calibration unit and a system for determining system errors and power values for the calibration of a network analyser.

The characterisation of high-frequency technical components, modules and systems using a vectorial network analyser is falsified by intermittent system errors of the measurement arrangement, for example, system errors caused by deviating impedances of the measurement lines. A system-error calibration of the measurement arrangement is required in order to correct these system errors. Accordingly, for example, as presented in DE 198 49 580 A1, the test port of the network analyser is connected sequentially to an open calibration standard, a short calibration standard and a matched-load calibration standard and, after excitation of the respective calibration standard with an excitation signal measured by the network analyser, the signal reflected from the respective calibration standard is measured by the network analyser. The system errors of the network analyser are determined from the measured values using a standard calibration method. The system errors determined in this case are included in the correction of the measured values of the device under test connected to the vectorial network analyser.

In network analysers, a level calibration or power-value calibration, by means of which the measured values of the device under test, which represent scaled wave frequencies, are transformed into absolute physical measured values for display on a display device, can be implemented alongside this system-error calibration. For this purpose, for example, the individual test ports of the network analyser are each connected to a power detector which registers the power value of the excitation signal generated at the respective test port and supplies it to the network analyser for power-value calibration.

The simultaneous implementation of a system-error calibration and a power-value calibration disadvantageously requires a multiple and therefore time-consuming connection of the individual test ports of the network analyser to the individual calibration standards or respectively to the power detector. In this context, since different test ports of the network analyser must be mutually contacted each time via screw connections to different calibration standards or respectively to a power detector, different connection transitions occur in each case, which represent an additional measurement uncertainty, especially in the case of higher measurement frequencies.

The object of the invention is therefore to provide a method, a calibration unit and a system for determining system errors and level values for the system-error and power-value calibration of a measurement arrangement containing a network analyser, which are characterised by a minimisation of connection effort and a minimisation of measurement uncertainty.

The object is achieved by a method for determining system errors and power values for the calibration of a network analyser with the features of claim 1, by a calibration unit with the features of claim 8 and by a system for determining system errors and power values for the calibration of a network analyser with the features of claim 12. Advantageous technical developments are specified in the respectively dependent claims.

According to the invention, the power detector is used both for power measurement and also as a calibration terminating resistor. This removes the need for a troublesome switch from calibration standard to power detector.

By preference, each test port of the network analyser is connected sequentially in each case individually to two calibration standards, especially an open calibration standard and a short calibration standard, and to a power detector. After the excitation of the respective test port with an excitation signal measured by the network analyser, the associated signal reflected in each case from the calibration standard, especially from the open calibration standard and from the short calibration standard, and from the power detector, is measured by the network analyser. In this context, the power detector with its input impedance assumes the task of the matched-load calibration standard.

From the measured signals, the network analyser preferably determines the individual system errors, which are used, in the case of a connection of a device under test to be measured to the respective test ports of the network analyser, for system-error correction of the incoming and outgoing wave frequencies measured at the individual test ports of the network analyser. In a second measurement, after the determination of the individual system errors, the power value of the excitation signal present at the respective test port is measured in at least one power detector connected in each case to a test port and supplied to the network analyser.

As a result of the simultaneous use of the power detector as a matched-load calibration standard for the system-error calibration and as a power-value meter for the power-value calibration, a further time-consuming connection of the respective test port to a matched-load calibration standard, an additional measurement uncertainty caused by re-connection transitions—namely the connection transitions between the respective test port and a matched-load calibration standard—is dispensed with, and the expensive purchase of a matched, broadband load calibration standard is avoided.

In order to use the power detector simultaneously as a matched-load calibration standard, the input impedance of the power detector is preferably matched to the input impedance of the test ports of the network analyser, which is typically 50 ohms. If the input impedance of the power detector is not matched exactly over the entire frequency response during manufacture, corresponding correction values, which achieve a correction of the system errors determined incorrectly with the non-matched power detector, are preferably required. These correction values are determined upon completion of the manufacture of the power detector, stored in the power detector and supplied to the network analyser to correct the matching.

Since the spectral characteristic of the input impedance of the power detector is typically temperature dependent, a temperature sensor is preferably provided in the interior of the power detector, which registers the current intrinsic temperature value of the power detector and supplies it to the network analyser for a temperature compensation.

While the use of the power detector as a matched-load calibration standard necessitates the connection of every test port of the network analyser to the power detector and the measurement of the signal reflected from the power detector in the case of an excitation, the power-value measurement by the power detector is required only at the test port of the network analyser at which the excitation signal is generated. For the power-value calibration of the incoming and outgoing signal waves in each case at all test ports in the case of an excitation at a single test port, the excitation test port in the determined system-error model should accordingly be connected to a further test port by a through-(T)-connection (German: Durchgangsverbindung), preferably via a through-(T)-connection without transmission loss, and the incoming signal wave at the other test port of the system-error model should be determined.

The use of the open calibration standard, the short calibration standard and the power detector as a calibration standard preferably allows the use of an additional, fourth calibration standard. One test port of the network analyser is connected in succession in each case to this additional fourth calibration standard, which is preferably realised as a reflecting calibration standard. With a known reflection behaviour of the additional, fourth calibration standard, the correctness of the system-error calibration implemented can be verified in the case of an excitation with an excitation signal at one of these test ports respectively and measurement of the excitation signal reflected by the additional fourth calibration standard.

Figure 2:
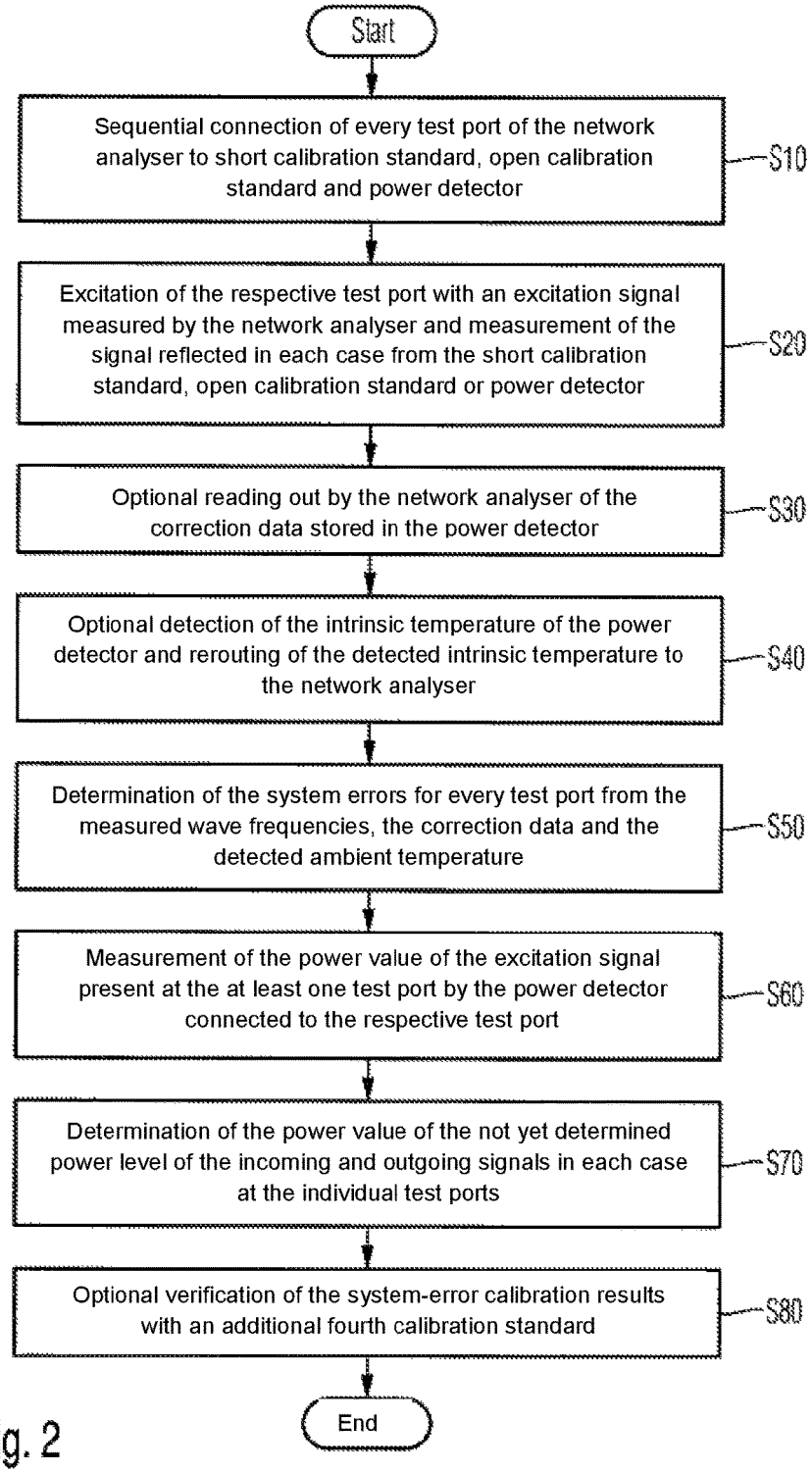

Exemplary embodiments of the method according to the invention, the calibration unit according to the invention and the system according to the invention for determining system errors and power values for the calibration of a network analyser are explained in detail in the following on the basis of the drawings. The Figs. of the drawings show:

FIG. 1 a block-circuit diagram of an exemplary embodiment of the system according to the invention with the calibration unit according to the invention for determining system errors and power values for the calibration of a network analyser; and FIG. 2 a flow diagram of an exemplary embodiment of the method according to the invention for determining the system errors and power values for the calibration of a network analyser.

Before the exemplary embodiment of the method according to the invention for determining the system errors and power values for the calibration of a network analyser, the calibration unit according to the invention and the system according to the invention for determining system errors and power values for the calibration of a network analyser are described in detail, the relevant mathematical context required for an understanding of the measurement of the power values will be explained in the following:

In general, the correction factor $K_i$ required for the power-value calibration of an outgoing signal wave $a_{ii}$ at a port i is obtained according to equation (1) from the ratio of the outgoing signal wave $a_{ii}^k$ measured with power-value correction at the port i by a power detector and the outgoing signal wave $a_{ii}^f$ measured without power-value correction and already system-error adjusted by the detector of the network analyser at the port i.

$$K_i = \frac{a_{ii}^k}{a_{ii}^f} \quad (1)$$

If the port i of the network analyser at which the excitation signal is generated is connected via a through-(T)-connection without transmission loss to a port j, the incoming signal wave $b_{ji}^f$ measured by the detector of the network analyser without power-value correction at this port j corresponds, according to equation (2), to the outgoing signal wave $a_{ii}^f$ measured by the detector of the network analyser without power-value correction at the port i, provided both measured values are system-error adjusted.

$$a_{ii}^f = b_{ji}^f \quad (2)$$

According to equation (3), this identity also applies for the corresponding power-value-corrected signal waves $a_{ii}^k$ and $b_{ji}^k$.

$$a_{ii}^k = b_{ji}^k \quad (3)$$

As a result of the identities shown in equations (2) and (3), the correction factor $K_i$ identical to equation (1) can be used according to equation (4) for the power-value calibration of the incoming signal wave $b_{ji}^f$ measured without power-value correction at a port j in the case of an excitation at port i and also for the power-value calibration of the outgoing signal wave $a_{ii}^f$ measured without power-value correction at the port i.

$$K_i = \frac{a_{ii}^k}{b_{ji}^f} \quad (4)$$

The accordingly required measurement of the incoming signal wave $b_{ji}^f$ measured without power-value correction at a port j can already be implemented after the determination of the system errors by connecting the port i in the accordingly determined system-error model to an arbitrarily selected port j via a through-(T)-connection without transmission loss, and by exciting the system-error model at the port i and measuring the signal wave $b_{ji}^f$ at the port j before the implementation of the power-value calibration.

Via the source-match factor (German: Quelle-Anpassungsfaktor) $\Gamma_{Si}$, the incoming signal wave measured without power-value correction at the port i is obtained according to equation (5) from the outgoing signal wave $a_{ii}^f$ measured without power-value correction at the port i when the excitation signal is generated at the port i:

$$b_{ii}^f = \frac{a_{ii}^f}{\Gamma_{Si}} \quad (1)$$

Since the source-match factor $\Gamma_{Si}$ at the port i has already been determined in the system-error calibration and taken into consideration in the system-error adjustment of the measured signal waves, the same correction factor $K_i$ can be used for the power-value calibration of the incoming signal wave $b_{ii}^f$ measured without power-value correction at the port i, according to equation (4), as in the case of the power-value-calibration of the outgoing signal wave $a_{ii}^f$ measured without power-value correction at the port i, provided the incoming signal wave $b_{ii}^f$ measured without power-value correction at the port i is further weighted, before the power-value calibration with the correction factor $K_i$, with the inverse source-match factor $1/\Gamma_{Si}$ at the port i determined in the system-error calibration.

Via the load-match factor (German: Last-Anpassungsfaktor) $\Gamma_{Lj}$, the outgoing signal wave $a_{ji}^f$ measured without power-value correction at the port j is obtained according to equation (6) from the outgoing signal wave $b_{ji}^f$ measured without power-value correction at the port j when the excitation signal is generated at the port i:

$$a_{ji}^f = b_{ji}^f \cdot \Gamma_{Lj} \quad (6)$$

Since the load-match factor $\Gamma_{Lj}$ at the port j has also already been determined in the system-error calibration and taken into consideration in the system-error adjustment of the measured signal waves, the same correction factor $K_i$ can be also used according to equation (4) for the power-valuecalibration of the outgoing signal wave $a_{ji}^f$ measured without power-value correction at the port j as in the case of the power-value calibration of the incoming signal wave $b_{ji}^f$ measured without power-value correction at the port j in the case of an excitation at the port i, provided the outgoing signal wave $a_{ji}^f$ measured without power-value correction at the port j is further weighted, even before the power-value calibration with the correction factor $K_i$, with the load-match factor $\Gamma_{Lj}$ at the port j determined in the system-error calibration.

This procedure in determining a correction factor $K_i$ must be implemented separately in each case for every port i at which an excitation signal is generated. In summary, the matrix $A^k$ with power-value-calibrated outgoing signal waves at the individual ports of the network analyser is obtained in each case according to equation (7A) by weighting the matrix $A^f$ with non-power-value calibrated outgoing signal waves according to equation (7C), in each case at the individual ports of the network analyser, with the correction matrix K containing the individual correction factors $K_1, \ldots, K_n$. In an equivalent manner, the matrix $B^k$ with power-value calibrated incoming signal waves in each case at the individual ports of the network analyser is obtained according to equation (7B) by weighting the matrix $B^f$ with non-power-value calibrated incoming signal waves, in each case at the individual ports of the network analyser, with the correction matrix K containing the individual correction factors $K_1, \ldots, K_n$.

$$A^k = A^f \cdot K \quad (7A)$$

$$B^k = B^f \cdot K \quad (7B)$$

$$K = \begin{bmatrix} K_1 & \cdots & 0 \\ \vdots & & \vdots \\ 0 & \cdots & K_n \end{bmatrix} = E \cdot \begin{bmatrix} K_1 \\ \vdots \\ K_n \end{bmatrix} \quad (7C)$$

With the use of a through-(T)-connection with transmission loss, the exact transmission loss $S_{21Through}$ of the through-(T)-connection is determined within the framework of the system-error calibration. The incoming signal wave $b_{ji}^f$ measured by the detector of the network analyser without power-value correction at the port j consequently correlates according to equation (8) via the determined transmission loss $S_{21Through}$ of the through-(T)-connection with the outgoing signal wave $a_{ii}^f$ measured by the detector of the network analyser without power-value correction at the port i. It is determined by connecting the port i in the accordingly determined system-error model to an arbitrarily selected port j via a through-(T)-connection with the determined transmission loss $S_{21Through}$ and exciting the system-error model at the port i and measuring the incoming signal wave $b_{ji}^f$ at the port j in the case of the excitation at the port i.

$$b_{ji}^f = a_{ii}^f \cdot S_{12Through} \quad (8)$$

The individual correction factors $K_1, \ldots, K_n$ each represent non-scaled values. Scaling of these correction factors $K_1, \ldots, K_n$ is possible in order to achieve a simpler implementation of the power-value calibration in terms of process-technology, for example, in a microprocessor, as will be shown in the following.

Since the outgoing power-value corrected wave signal $a_{ii}^k$ in the case of an excitation and power-value measurement at port i according to equation (9) is very much larger than the respectively outgoing power-value corrected wave signals $a_{ji}^k$ at the other ports j, the outgoing signal wave $a_{ii}^f$ in the case of the excitation and power-value measurement at the port i is used as the scaling value. In this context, the outgoing non-power-value-corrected wave signal $a_{ii}^f$ at the port i in the case of an excitation and power-value measurement is excluded as a scaling value because it is not a non-scaled value.

$$a_{ii}^k >> a_{ji}^k \forall j \neq i \quad (9)$$

Starting from the general relationship between the power-value calibrated matrix A with the individual power-value-corrected outgoing signal waves and the power-value calibrated matrix B with the individual power-value-corrected incoming signal waves via the scattering matrix S according to equation (10), a relationship according to equation (11) is obtained for the scaled correction factor $K_i$.

$$A \cdot K = S \cdot B \cdot K \quad (10)$$

$$\begin{bmatrix} b_{11} & b_{12} & \cdots & b_{1n} \\ b_{21} & b_{22} & \cdots & b_{2n} \\ \vdots & \vdots & & \vdots \\ b_{n1} & b_{n2} & \cdots & b_{nn} \end{bmatrix}.$$

$$K = \begin{bmatrix} S_{11} & S_{12} & \cdots & S_{1n} \\ S_{21} & S_{22} & \cdots & S_{2n} \\ \vdots & \vdots & & \vdots \\ S_{n1} & S_{n2} & \cdots & S_{nn} \end{bmatrix} \cdot \begin{bmatrix} a_{11} & a_{12} & \cdots & a_{1n} \\ a_{21} & a_{22} & \cdots & a_{2n} \\ \vdots & \vdots & & \vdots \\ a_{n1} & a_{n2} & \cdots & a_{nn} \end{bmatrix} \cdot K$$

$$[\vec{b}_1 \ \vec{b}_2 \ \cdots \ \vec{b}_n] \cdot K = S \cdot [\vec{a}_1 \ \vec{a}_2 \ \cdots \ \vec{a}_n] \cdot K$$

$$\vec{b}_i \cdot \frac{K_i}{a_{ii}^k} = S \cdot \vec{a}_i \cdot \frac{K_i}{a_{ii}^k} \quad (11)$$

On the basis of this mathematical background, the exemplary embodiment of the method according to the invention for determining system errors and power values for the calibration of a network analyser will be explained in detail in the following on the basis of the flowchart in FIG. 2, and the exemplary embodiment of the system according to the invention for determining system errors and power values for the calibration of a network analyser with the calibration unit according to the invention will be explained in greater detail on the basis of the block-circuit diagram in FIG. 2.

In the first method step S10, the individual test ports $1_1, \ldots, 1_i, 1_j, \ldots, 1_n$ of the network analyser 2 are connected sequentially in each case to a short calibration standard 3, an open calibration standard 4, and to a power detector 5, as indicated in FIG. 1, via a high-frequency line 6. Instead of the short calibration standard 3 and the open calibration standard 4, other, different calibration standards, for example, a near-short calibration standard and a near-open calibration standard can also be used. The calibration standards used should provide a maximum possible difference in magnitude and/or phase over the entire frequency range used.

In the next method step S20, the short calibration standard 3, the open calibration standard 4 or the power detector 5 connected respectively to each test port $1_1, \ldots, 1_i, 1_j, \ldots, 1_n$ of the network analyser 2 via a high-frequency line 6 is excited by an excitation signal generated and measured in the network analyser 2, which is supplied to the respective test port $1_1, \ldots, 1_i, 1_j, \ldots, 1_n$. The signal reflected in this context from the short calibration standard 3, open calibration standard 4 or power detector 5 is measured within the same method step S20 in the network analyser 2. The calibration standards 3, 4 and 11 and the power detector are preferably integrated within a calibration unit 13.

If the input impedance of the power detector 5 is not matched ideally to the input impedance of the individual test ports $1_1, \ldots, 1_i, 1_j, \ldots, 1_n$ of typically 50 ohms, in the next optionally implemented method step S30, correction data for correcting the system errors determined incorrectly in the case of an error-matched power detector 5 are read out from a buffer 6 contained in the power detector 5. The reading out of the correction data from the buffer 6 in the power detector 5 typically takes place via a data port 7 additionally provided in the power detector 5 or respectively in the calibration unit 13, a data signal line 8 and a data port 9 provided for this purpose in the network analyser 2. The data transfer is also possible in a wireless manner. At completion of manufacture, the correction data of the error-matched power detector 5 are determined in a measurement and calculation step implemented on the power detector 5 in the factory and stored in the buffer 6. The correction data are preferably frequency dependent and/or temperature dependent.

Temperature-dependent changes in the input impedance of the power detector 5, especially temperature-dependent changes in the frequency dependence of the input impedance of the power detector 5, must be determined and compensated in order to determine corrected system errors. For this purpose, in the next optionally implemented method step S40, the intrinsic temperature of the power detector 5 is detected with an appropriate temperature sensor 10 integrated in the interior of the power detector 5 and, for example, read in from the network analyser 2 via the data-signal line 8 and the data port 9 provided in the network analyser 2.

In the next method step S50, the system errors of the measurement arrangement containing the network analyser 2 are determined from the excitation signals and the reflected signals measured in each case at its individual test ports $1_1, \ldots, 1_i, 1_j, \ldots, 1_n$ when connected to the short calibration standard 3, the open calibration standard 4 and the power detector 5 using a standard calibration method—for example, the Open-Short-Match (OSM) method (German: Leerlauf-Kurzschluss-Anpassung-Verfahren).

In this context, in the case of a power detector 5 with somewhat error-matched input impedance, the still-uncorrected system errors determined by the calibration method are additionally corrected with the correction data stored in the buffer 6 of the power detector 5 in order to compensate the distortion in the originally determined system errors caused by the error-matched input impedance of the power detector 5.

In a similar manner, temperature-dependent changes in the input impedance of the power detector 5 are compensated in the determined system errors by means of correction data which are obtained from the detected intrinsic temperature of the power detector 5 and determined in the network analyser 2 from the intrinsic temperature communicated by the temperature sensor 10 integrated in the power detector 5.

In the next method step S60, the power detector 5 connected in each case to the respective test port $1_1, \ldots, 1_i, 1_j, \ldots, 1_n$ is supplied a second time with an excitation signal generated in the network analyser 2. The power detector 5 registers the power value of the excitation signal and transmits the registered power value, for example, via its data port 7 and the data-signal line 8, to the data port 9 of the network analyser 2. At each test port $1_1, \ldots, 1_i, 1_j, \ldots, 1_n$ respectively, a power value of the excitation signal is determined with the power detector 5. By means of the power value of the excitation signal $a_{ii}^k$, measured, for example, at test port $1_i$, and the incoming signal wave $b_{ji}^f$, measured without power-value correction following the system-error calibration at the test port $1_j$ of the system-error model in the case of an excitation at test port $1_i$ of the system-error model and a connection of test port $1_i$ to test port $1_j$ of the system-error model via the through-(T)-connection without transmission loss, the correction factor $K_i$ for all non-power-value-corrected incoming and outgoing signal waves $\vec{a}_i^f$ and $\vec{b}_i^f$ in the case of the excitation at port i is determined according to equation (4).

In this context, the outgoing signal wave $a_{ii}^f$ generated at the test port $1_i$ and measured without power-value correction and all incoming signal waves $b_{ji}^f$ measured without power-value correction at the other test ports $1_j$ in the case of an excitation at the test port $1_i$ are weighted directly with the correction factor $K_i$. The outgoing signal waves $a_{ji}^f$ measured in each case without power-value correction at the other test ports $1_j$ are further weighted, before the correction with the correction factor $K_i$, with the load-match factor $\Gamma_{Lj}$ at the test port $1_j$ determined in the system-error calibration. The incoming signal wave $b_{ii}^f$ measured without power-value correction at the test port $1_i$ is further weighted, before the correction with the correction factor $K_i$, with the inverse source-match factor $1/\Gamma_{Si}$ at the test port $1_i$ determined in the system-error calibration.

If a through-(T)-connection with transmission loss is used instead of a through-(T)-connection without transmission loss in the non-power-value-corrected measurement of an incoming signal wave $b_{ji}^f$ at a test port $1_j$ of the system-error model in the case of an excitation at the test port $1_i$, the associated transmission loss $S_{21\,Through}$ must be determined in advance by means of calibration and integrated between the test ports $1_i$ and $1_j$ of the system-error model according to equation (8).

If scaled correction factors are used, the power level $a_{ii}^k$ of the excitation signal at the test port $1_i$ measured with the power detector 5 must be used for the scaling of the correction factor $K_i$.

The power values determined for the incoming and outgoing signals in each case at the individual test ports $1_1, \ldots, 1_i, 1_j, \ldots, 1_n$ of the network analyser 2 are used for a scaled display of these signals on a display device 12 of the network analyser 2.

In the final optionally implemented method step S80, the correctness of the system-error calibration is verified with the assistance of an additional, fourth calibration standard 11, which is preferably a reflecting calibration standard, that is, an open calibration standard, a short calibration standard or a load calibration standard with a given impedance. The exact parameters—especially the impedance value—of this fourth calibration standard 11 must be determined in advance and communicated to the network analyser 2. This additional fourth calibration standard 11 is connected sequentially to each of the test ports $1_1, \ldots, 1_i, 1_j, \ldots, 1_n$ and, from the measurement of the excitation signal present at the respective test port and of the excitation signal reflected from the respective calibration standard, the correctness of the system-error calibration determined with the method according to the invention is accordingly evaluated indirectly.

The invention is not restricted to the exemplary embodiments presented. In particular, all combinations of all of the features claimed in each case in the claims, of all of the features disclosed in each case in the description and of all of the features presented in each case in the Figs. of the drawings fall within the scope of the invention.

The invention claimed is:

1. A method for determining system errors and power values for the calibration of a network analyzer by a measuring device providing at least one test port, wherein a power detector is used both for power measurement and also as a calibration terminating resistor, and
    wherein a plurality of test ports of the network analyzer are connected to an additional, fourth calibration standard for the verification of the results of the calibration.

2. The method according to claim 1 comprises of the following method steps:
    sequential connection of the individual test ports to at least two different calibration standards, especially to a short calibration standard and an open calibration standard, and to the power detector,
    measurement of a signal reflected from the calibration standards and from the power detector when the respective test port is excited with a measured excitation signal,
    determination of system errors for every test port from the respectively measured excitation signal and the respectively measured reflected signals, and
    measurement of the power value of the excitation signal at least at one test port by the power detector connected in each case to this test port.

3. The method according to claim 1,
    wherein the input impedance of the power detector is matched to the input impedance of the at least one test port of the network analyzer.

4. The method according to claim 1,
    wherein in the case of a non-ideal matching of the input impedance of the power detector to the input impedance of the at least one test port of the network analyzer, correction data of the power detector determined during manufacture of the power detector are deposited in a buffer of the power detector, which are taken into consideration during the calibration.

5. The method according to claim 1,
    wherein an intrinsic temperature of the power detector (5) is measured, and the measurement result for the intrinsic temperature is supplied to the network analyzer (2), and the measurement result for the intrinsic temperature is taken into consideration in the calibration.

6. The method according to claim 1,
    wherein the measurement of the power value of the excitation signal is implemented by the power detector only at the excitation test port of the network analyzer.

7. The method according to claim 6,
    wherein for the calibration of the power values of the respectively incoming and outgoing signal waves at all test ports in the case of an excitation at one test port, a correction factor is used, which is obtained from the ratio of the power value of the excitation signal measured at the excitation test port and from an incoming signal wave measured at a further test port of a system error model, if, within the system-error model, the excitation test port is connected to the further test port via a through-(T)-connection.

8. A calibration unit for determining system errors and at least one power value for the calibration of a network analyzer with at least one test port, wherein the calibration unit provides a power detector, wherein the power detector is used both for the power measurement and also as a calibration terminating resistor, and
    wherein an additional fourth calibration standard for the verification of the results of the calibration can be connected sequentially with the calibration standards and with the power detector to a plurality of individual test ports of the network analyzer.

9. The calibration unit according to claim 8,
    whereby two calibration standards, especially a short calibration standard and an open calibration standard, which can be connected together with the power detector in each case individually and sequentially to each individual test port of the network analyzer.

10. The calibration unit according to claim 8,
    wherein a temperature sensor integrated in the interior of the power detector, which can be connected to the network analyzer, is provided.

11. The calibration unit according to claim 8,
    wherein the power detector provides a buffer in which correction data determined during manufacture are disposed, which characterise the deviation of the input impedance of the power detector from the input impedance of the at least one test port of the network analyzer and which are taken into consideration in the calibration of the network analyzer.

12. A system for determining system errors and at least one power value for the calibration of a network analyzer, with a network analyzer comprising at least one test port and a power detector,
    wherein the power detector is used both for the power measurement and also as a calibration terminating resistor, and
    wherein an additional fourth calibration standard for the verification of the results of the calibration can be connected sequentially with the calibration standards and with the power detector to a plurality of individual test ports of the network analyzer.

* * * * *